United States Patent
Brau et al.

(10) Patent No.: US 7,768,264 B1
(45) Date of Patent: Aug. 3, 2010

(54) METHOD AND APPARATUS FOR MR IMAGE RECONSTRUCTION USING CORRELATION VALUES

(75) Inventors: Anja C. S. Brau, Menlo Park, CA (US); Philip James Beatty, Menlo Park, CA (US)

(73) Assignees: General Electric Company, Schenectady, NY (US); The Board of Trustees of the Leland Stanford, Jr. University, Palo Alto, CA (US)

( * ) Notice: Subject to any disclaimer, the term of this patent is extended or adjusted under 35 U.S.C. 154(b) by 566 days.

(21) Appl. No.: 11/744,329

(22) Filed: May 4, 2007

(51) Int. Cl.
    *G01V 3/00* (2006.01)
(52) U.S. Cl. ...................... 324/309; 324/307
(58) Field of Classification Search ............... 324/309, 324/307
    See application file for complete search history.

(56) References Cited

U.S. PATENT DOCUMENTS

| | | | |
|---|---|---|---|
| 6,841,998 B1 | 1/2005 | Griswold | |
| 7,279,893 B1 * | 10/2007 | Marinelli et al. | 324/307 |
| 7,492,153 B2 * | 2/2009 | Brau et al. | 324/309 |
| 7,592,809 B1 * | 9/2009 | King et al. | 324/309 |

* cited by examiner

*Primary Examiner*—Louis M Arana
(74) *Attorney, Agent, or Firm*—Ziolkowski Patent Solutions Group, SC

(57) ABSTRACT

A system and method for parallel imaging is disclosed that generates linear combination coefficient weights by solving systems of linear equations formulated with correlation values. An MRI apparatus includes a computer programmed to acquire MR data from an imaging volume for a plurality of encoding locations using an array of RF receiver coils. Correlation values are calculated from the MR data. From these calculated correlation values, synthesis weights are generated. An image is then reconstructed based on an application of the synthesis weights to at least a portion of the MR data acquired from the array of RF receiver coils.

27 Claims, 6 Drawing Sheets

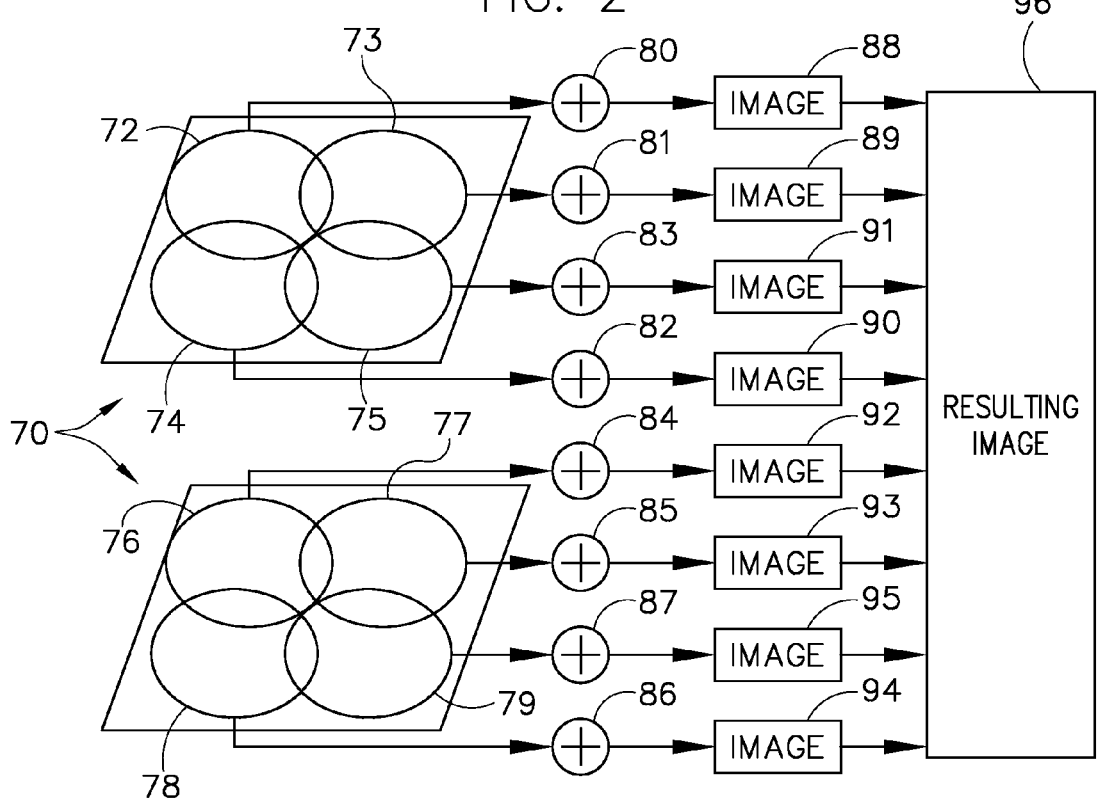
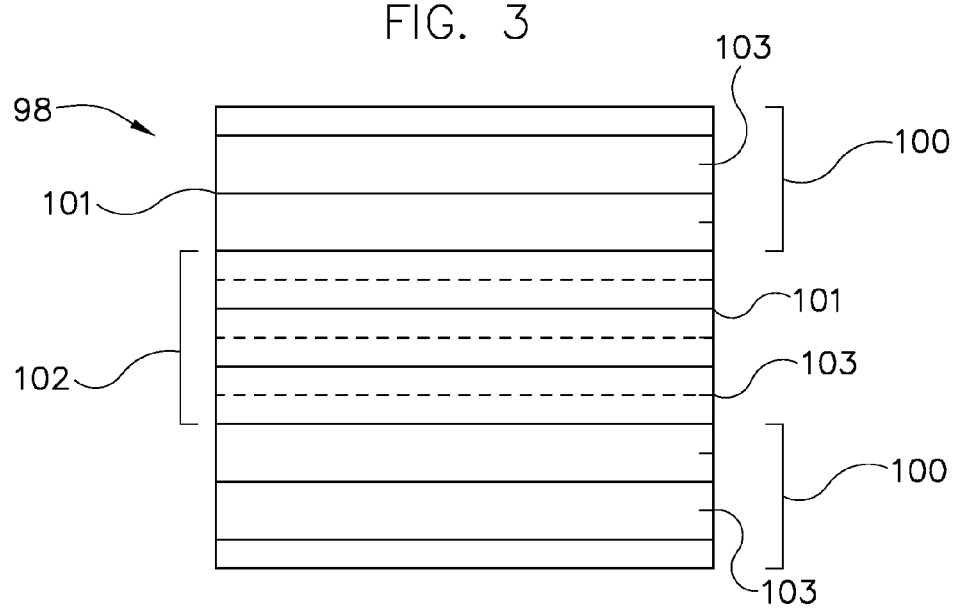

FIG. 7
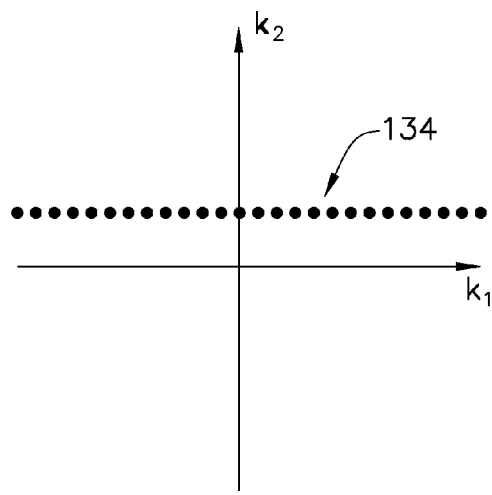
FIG. 8
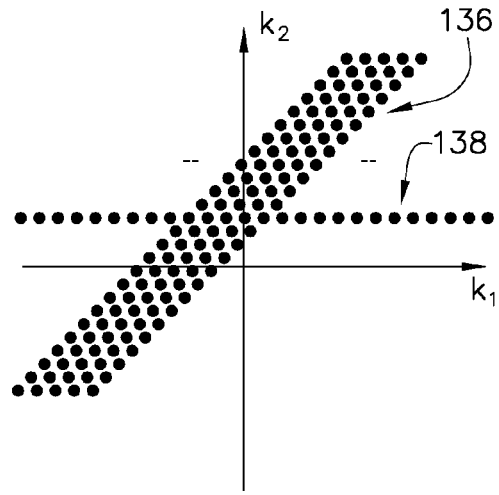
FIG. 9(a)
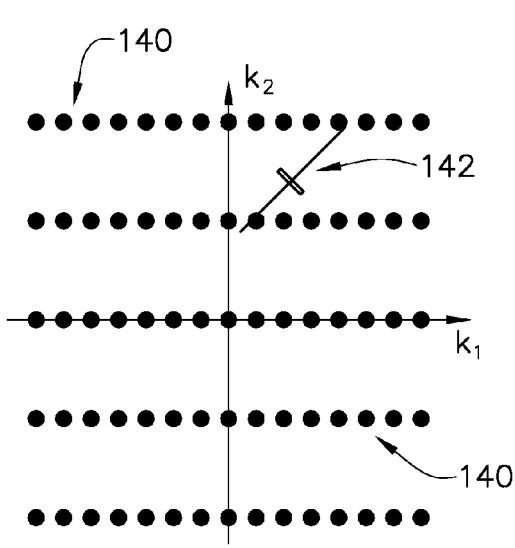
FIG. (9b)
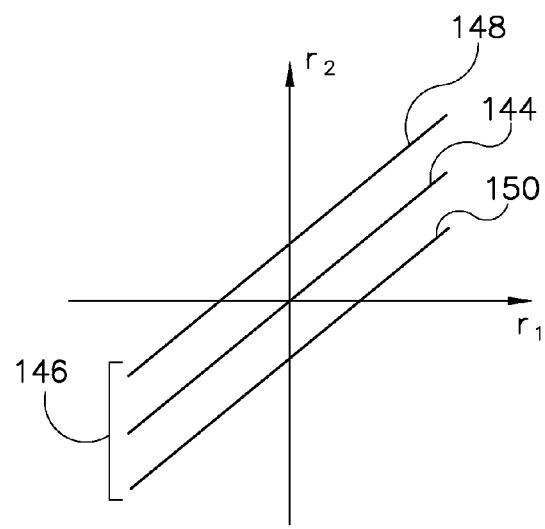

METHOD AND APPARATUS FOR MR IMAGE RECONSTRUCTION USING CORRELATION VALUES

GOVERNMENT LICENSE RIGHTS

The present invention was made at least in part with Government support under Contract Nos. HL075803 and HL039297, awarded by the National Institutes of Health. The Government may have certain rights in the invention.

BACKGROUND OF THE INVENTION

The present invention relates generally to diagnostic imaging and, more particularly, to a system and method of calculating linear combination coefficient weights used for reconstructing magnetic resonance (MR) images in a parallel acquisition scan.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

One technique that has been developed to accelerate MR data acquisition is commonly referred to as "parallel imaging" or "partial parallel imaging". In parallel imaging, multiple receiver coils acquire data from a region or volume of interest. Thus, parallel imaging is used to accelerate data acquisition in one or more dimensions by exploiting the spatial dependence of phased array coil sensitivity. Parallel imaging has been shown to be not only successful in reducing scan time, but also in reducing image blurring and geometric distortions. Moreover, parallel imaging can be used to improve spatial or temporal resolution as well as increased volumetric coverage.

There are several types of parallel imaging reconstruction methods that have been developed to generate the final, unaliased image from accelerated data. One such group of methods is auto-calibrating based techniques, which calculate reconstruction weights (i.e., linear combination coefficient weights) necessary to synthesize unacquired data directly from acquired data in k-space using an algorithm that does not require coil sensitivity estimates. In such auto-calibration based techniques, the reconstruction weights are calculated from a small amount of fully sampled calibration data that is typically embedded within the scan (i.e., "self-calibration"), but can also be acquired before or after the scan.

As an example, in the GRAPPA method, the linear combination weights are determined directly from the fully sampled calibration data. That is, a set of linear combination weights is generated by way of one or more systems of linear equations. Calibration data is entered into a matrix in the linear equations to determine the linear combination weights. While the filling of such matrices with the calibration data allows for accurate calculation of the linear combination weights, the large amount of data increases the size of the matrices, which leads to a computation time that is greater than what is desirable. For example, a matrix of 100×5000 (2-D) or 300×50,000 (3-D) is not uncommon in many GRAPPA based techniques. A matrix size of that magnitude can be problematic for 2D reconstructions. Furthermore, the size of the matrices increases exponentially with the reconstruction of 3-D images as compared to 2-D images, leading to an even greater length of computation time for 3-D image reconstruction.

It would therefore be desirable to have a method for calculating the linear combination coefficient weights used in many parallel imaging methods that reduces the computation time necessary for image reconstruction. It would also be desirable for such a method to achieve and maintain high image quality results in the reconstruction and for the method to be applicable to a number of different parallel imaging techniques.

BRIEF DESCRIPTION OF THE INVENTION

The present invention provides a system and method for parallel imaging that overcomes the aforementioned drawbacks. The invention includes a parallel imaging technique that generates linear combination coefficient weights by solving systems of linear equations formulated with correlation values rather than calibration data.

Therefore, according to one aspect of the present invention, an MRI apparatus includes a magnetic resonance imaging (MRI) system having a plurality of gradient coils positioned about a bore of a magnet to impress spatially dependent changes to a polarizing magnetic field. The MRI apparatus also includes an RF transceiver system and an RF switch controlled by a pulse module to collect RF signals from an array of RF receiver coils to acquire MR images. A computer in the MRI apparatus is programmed to acquire MR data from an imaging volume for a plurality of encoding locations using the array of RF receiver coils. The computer calculates correlation values from the MR data and generates synthesis weights based on the correlation values. The computer is further programmed to reconstruct an image based on an application of the synthesis weights to at least a portion of the MR data acquired from the array of RF receiver coils.

In accordance with another aspect of the invention, a method of image reconstruction of MRI data from a plurality of receiver coils includes the steps of performing an accelerated scan of a field of view with the plurality of receiver coils and acquiring k-space data from the accelerated scan for a number of k-space lines that is less than a complete number of k-space lines in the field of view. The method also includes the steps of acquiring calibration data from the accelerated scan and calculating correlation values from the calibration data. The method further includes the steps of synthesizing linear combination coefficient weights from at least one system of equations having a matrix of correlation values therein and generating an image of the field of view from the linear combination coefficient weights and the k-space data acquired in the accelerated scan.

In accordance with yet another aspect of the invention, a computer readable storage medium having a computer program stored thereon represents a set of instructions that are executed by a computer. The instructions causes the computer to obtain k-space data from a region of interest for a plurality of encoding locations from an RF receiver coil array, wherein each encoding location corresponds to a k-space location and a specified receiver coil in the RF receiver coil array and wherein the k-space data includes a reduced k-space data set and calibration data. The instructions also cause the computer to calculate correlation values for the plurality of encoding locations, each correlation value relating a first encoding location to a second encoding location and wherein the correlation value relating the first and second encoding locations is derived from a set of k-space data points. The instructions further cause the computer to generate linear combination coefficient weights for each of the receiver coils in the RF receiver coil array based on the correlation values and store the linear combination coefficient weights in memory.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 2 is a schematic diagram of a coil array usable with the MR imaging system shown in FIG. 1.

FIG. 3 is a schematic diagram illustrating a preferred MR data acquisition by the coil array shown in FIG. 2.

FIG. 7 is a schematic diagram of correlation values plotted in a $K_1$, $K_2$ plane according to the calculations shown in FIG. 6.

FIG. 8 is a schematic diagram of correlation values plotted in a $K_1$, $K_2$ plane according to another embodiment of the present embodiment.

FIG. 9(a) is a schematic diagram of correlation values plotted in a $K_1$, $K_2$ plane according to another embodiment of the present embodiment.

FIG. 9(b) is a schematic diagram of an $r_1$, $r_2$ plane Fourier transformed from a $K_1$, $K_2$ plane.

DETAILED DESCRIPTION OF THE INVENTION

The present invention is directed to a parallel imaging reconstruction technique that reduces the computation requirements for calculating linear combination coefficient weights. The technique is applicable to numerous parallel imaging methods and is used for efficiently reconstructing a magnetic resonance (MR) image.

K-space is well-known in the art of MR imaging as a matrix that functions as, or is equivalent to, a "frequency domain" repository for positive and negative spatial frequency values that are encoded as complex numbers, e.g., a+bi, i=sqrt(−1). That is, the k-space matrix is generally recognized as the repository for spatial frequency signals acquired during evolution and decay of an MR echo. The k-space matrix is typically filled with frequency encoded data in the $k_x$ direction by a frequency encode gradient and in the $k_y$ direction by a phase encode gradient, and can also include phase encoded data in the $k_z$ direction by a second phase encode gradient. Data acquired from the echo is deposited in the k-space matrix in a row, specifically determined by the frequency and phase encode gradient strengths applied during MR signal evolution. K-space is generally filled one row at a time in a Cartesian manner. After all the k-space has been acquired, the elements of the k-space matrix contain positionally-dependent phase change variations along the $k_x$ (frequency encode) and $k_y$ (phase encode) direction. A 2D inverse Fourier transform decodes the frequency domain information. The 2D Fourier transform is a two step process. First, a row-by-row 1D Fourier transform converts each row of k-space data. After the row-by-row Fourier transform, a column-by-column 1D Fourier transform is performed. Collectively, the pair of 1D Fourier transforms converts the k-space data from the frequency domain (k-space data) to the spatial domain (image space data). An image is then reconstructed from the image matrix illustrating spatial and contrast characteristics of the object imaged.

Figure 1:
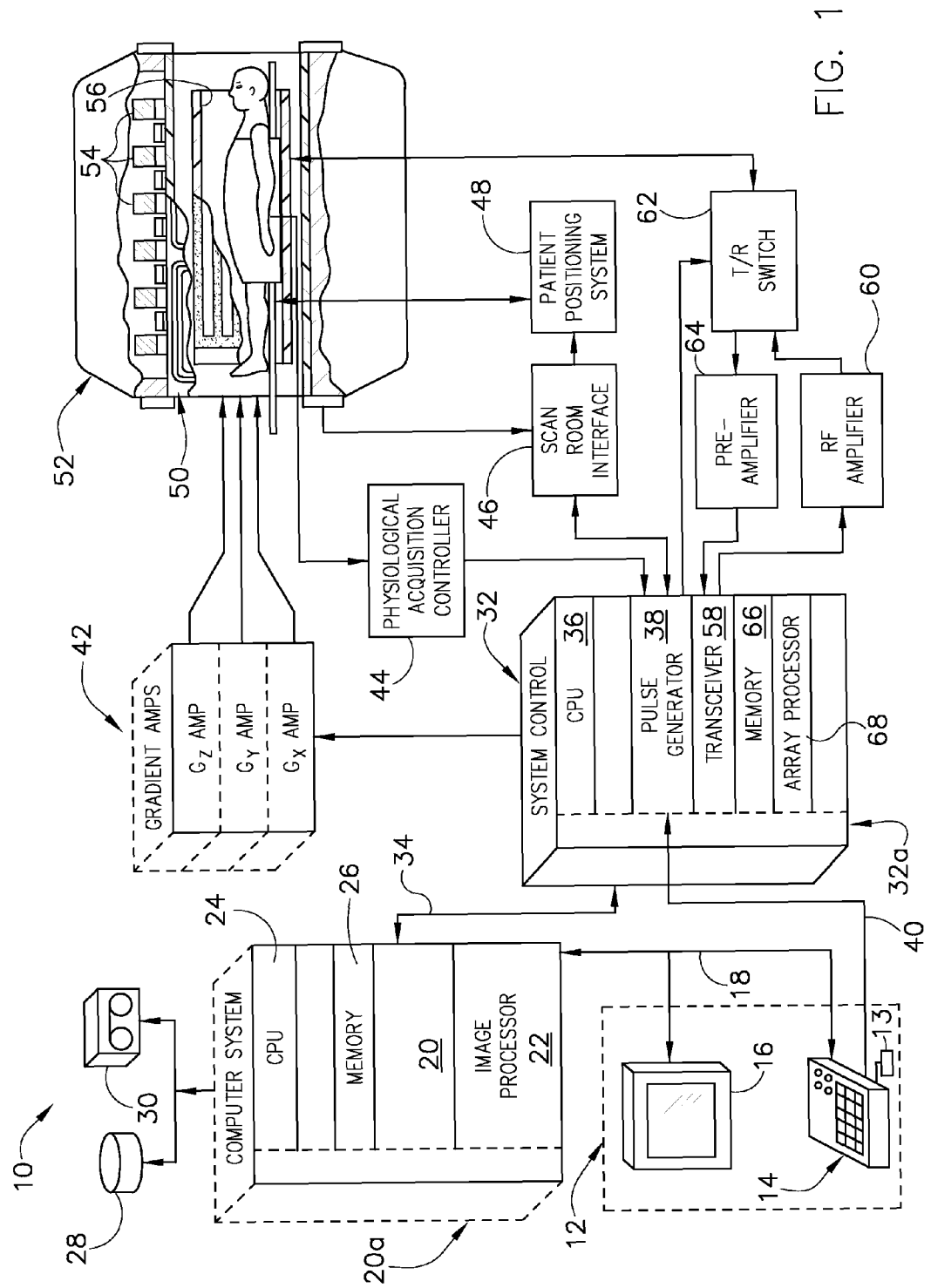
FIG. 1 is a schematic block diagram of an MR imaging system incorporating the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The MR system described in FIG. 1 may also be equipped with a receive coil array that picks up the MR signals. Such coil arrays are well-known in the art and include whole body arrays as well as partial body arrays, such as head coil arrays, cardiac coil arrays, and spine coil arrays. As will be described, the invention includes a parallel imaging method wherein a region or volume of interest is sampled with an array of RF receive coils. In this regard, the invention is not limited to a particular coil array type or orientation.

Referring now to FIG. 2, a schematic representation of a conventional torso RF coil array 70 is illustrated. The torso RF coil array 70 is a surface coil used to acquire imaging data for a field-of-view (FOV) and includes eight separate coil elements 72-79 (i.e., receiver coils). Each coil element samples the FOV by detecting changes in excited nuclei in the FOV and transmits signals indicative of that which is detected to separate data acquisition channels 80-87, respectively. In one embodiment, the data from each channel is then used to reconstruct a "coil" image 88-95 whereupon the respective coil images are combined into a composite image 96 using one of a number of known summation techniques, e.g., sum of squares. One skilled in the art will appreciate that the coil array illustrated in FIG. 2 is exemplary and that the number of coils in the coil array can vary, and furthermore, that individual "coil" images 88-95 need not be constructed in order to form image 96, such that various other parallel imaging techniques can be implemented (e.g., VD-AUTO-SMASH).

As is known in the art of parallel imaging, the sensitivity of each receiver coil element to the FOV can be exploited to accelerate the data acquisition process (i.e., perform an accelerated scan). The image data of each coil are multiplied by the coil sensitivity inherent to each coil element. The corresponding k-space data are convolved with the Fourier Transform of the spatial coil sensitivity distribution. The spatial coil sensitivity variation imposed by the individual receive coils provides additional spatial encoding functionality complementary to regular gradient encoding that is the basis of all parallel imaging methods. In 2D imaging, that sensitivity is exploited to reduce the number of phase encoding steps in one dimension or direction. In 3D imaging, that sensitivity can be exploited to reduce the number of phase encoding steps in up to two dimensions or directions.

Since, in practice, it can be extremely difficult to identify the coil sensitivity inherent to each coil element, auto-calibrating techniques are often implemented for parallel imaging. FIG. 3 shows a set of MR data 98 that is acquired by way of a receiver coil in the RF coil array. The set of MR data 98 comprises k-space data sampled from a reduced FOV by a respective receiver coil and includes imaging data lines 100 and calibration data lines 102, respectively. The imaging data lines 100 are acquired at a plurality of source locations 101 and the calibration data lines 102 are acquired at a plurality of source 101 and target 103 locations. As shown, the set of MR data is undersampled in the phase encoding direction. That is, a reduced number of phase encoding steps are undertaken so as to reduce scan time. Those skilled in art will recognize that the calibration data 102 can also be acquired separately rather than embedded within the scan, so that full acceleration can be accomplished for the parallel imaging scan.

As will be described here below, the missing phase encoding lines are synthesized mathematically by way of the acquired data and from coil weighting functions (i.e., linear combination coefficient weights, synthesis weights). Linear combination weights can be found that reduce fitting errors and lead to improved image quality. The determination of the linear combination weights occurs via a fit between calibration data 102. More specifically, the linear combination weights are derived from a fit between calibration data 102 acquired at source locations 101 and target locations 103. In order to determine which data in calibration data 102 is source data and which is target data, a pattern of source/target locations 101, 103 is taken from imaging data lines 100, and this pattern is used to determine which data points in calibration data 102 are source 101 and which are target 103. Once the source data is fitted to the target data in calibration data 102, the linear combination weights can be calculated and ultimately applied to imaging data lines 100 to fill in unacquired data at target locations 103.

The fit between calibration data 102 is determined by one or more systems of linear equations and can vary based on various factors, such as coil configuration. As described herein below, a set of linear combination weights is generated by way of one or more systems of linear equations. However, rather than solving the systems of linear equations directly from the fit between calibration data points, an intermediate calculation is performed using the calibration data to calculate a plurality of complex valued numbers, identified herein as "correlation values". These correlation values are entered into a matrix in the linear equations to determine the linear combination weights, thereby reducing the size of the matrix in the linear equations.

A correlation value relates two encoding locations (or encoding vectors) to each other, each encoding location being specified by a pair of values, (j, k), that are defined by an integer coil index, j, and a continuous-valued three-tuple k-space location, k, to uniquely identify an encoding function. Encoding locations are selected from calibration data that has been plotted in k-space on a $K_x$-$K_y$ plane, with each calibration data point having a k-space location, k, that corresponds with a specified receiver coil, j, in the RF coil array.

Figure 4:
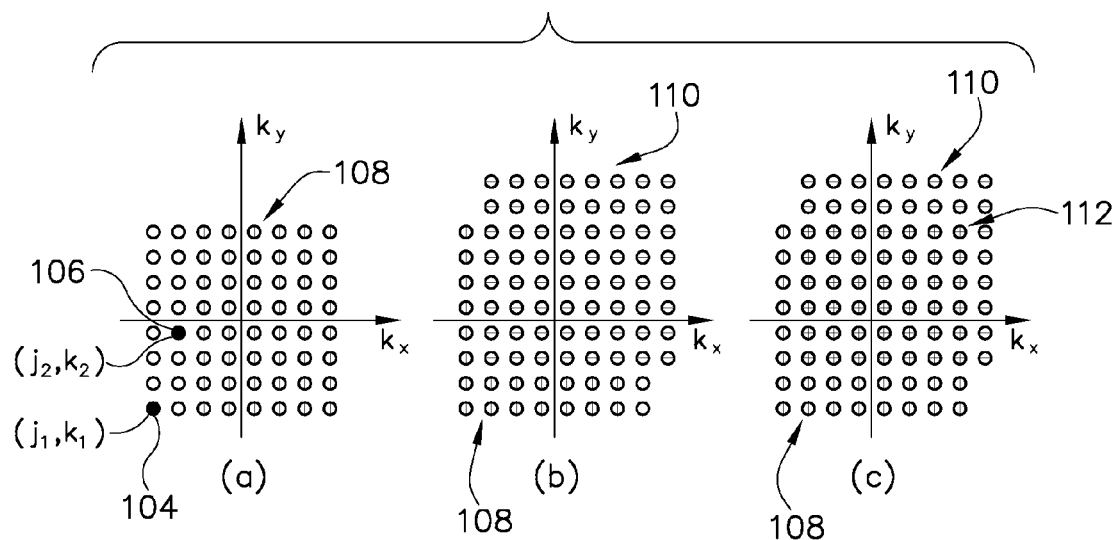
FIGS. 4(a)-4(c) are schematics of calibration data plotted in a k-space plane according to one embodiment of the present embodiment.

Referring now to FIG. 4, in determining a correlation value that relates a first encoding location ($j_1$, $k_1$) 104 to a second encoding location ($j_2$, $k_2$) 106, a set 108 of calibration points in a surrounding k-space neighborhood is examined. The set 108 of calibration points is not restrained to k-space locations local to the two encoding locations and can be in a completely separate part of k-space or from a plurality of k-space locations. Regardless of the exact k-space location(s) of set 108, the correlation value relating the first encoding location ($j_1$, $k_1$) 104 to the second encoding location ($j_2$, $k_2$) 106 is determined from the set 108 of calibration data by:

$$c(j_1, k_1; j_2, k_2)) = \sum_{k=k_1}^{k_c} d_{j_1}^*(k + k_1) d_{j_2}(k + k_2), \quad \text{[Eqn. 1]}$$

where $k_1$ thru $k_C$ denote C calibration points and $d_j(k)$ denotes data acquired at encoding location (j, k). A correlation value relating each distinct pair of encoding locations can be determined individually from Eqn. 1 by way of the acquired calibration data. Thus, a full set of correlation values can be calculated by this method, and in turn, linear combination weights can be generated for each of the receiver coils in the RF coil array.

The relationship between certain distinct correlation values also allows for the generation of additional correlation values with reduced computation requirements. That is, rather than calculating additional correlation values as set forth in Eqn. 1 via a complete new set of calculations including all individual calibration data points in another set, it is possible to take advantage of overlapping calculations to generate additional correlation values from previously derived correlation values (i.e., an "overlap method"). For pairs of encoding locations having a constant difference value between a first three-tuple k-space location and a second three-tuple k-space location (i.e., where $k_2$-$k_1$ is a constant value), a plurality of correlation values can be calculated by making use of overlapping calculations. Referring again to FIG. 4, a correlation value relating a first encoding location for coil $j_1$ and k-space location $k_1$ 104 to a second encoding location for coil $j_2$ and k-space location $k_2$ 106 can be calculated from the set 108 of calibration data as shown in FIG. 4(a) and as set forth in Eqn. 1. A correlation value for a differing pair of encoding locations can make use of the calculations performed in generating the first correlation value. That is, FIG. 4(b) shows a set 110 of calibration data that is offset from set 108 by a distance $\Delta k$. Referring now to FIG. 4(c), a portion of the calibration data in set 108 and set 110 overlap and are shared calibration data points 112. The sum of these shared calibration data points 112 has already been calculated for finding the previously generated correlation value relating encoding locations ($j_1$, $k_1$) 104 and ($j_2$, $k_2$) 106 as set forth in Eqn. 1. For further pairs of encoding locations having a same difference value as $k_2$-$k_1$ (i.e., a constant k-space offset, $\Delta k$), these previously summed calibration data points can be used in calculating the correlation values for these additional pairs of encoding locations. This is described by:

$$c(j_1, k_1 + \Delta k; j_2, k_2 + \Delta k)) = \sum_{k=k_1}^{k_c} d_{j_1}^*(k + k_1 + \Delta k) d_{j_2}(k + k_2 + \Delta k) \quad \text{[Eqn. 2]}$$

$$= \sum_{k'=k_1+\Delta k}^{k_c+\Delta k} d_{j_1}^*(k' + k_1) d_{j_2}(k' + k_2).$$

The implementation of such "overlapping" calculations allows for the generation of a plurality of correlation values between a pair of receiver coils, $j_1$ and $j_2$, that have encoding locations with a constant value between their first and second three-tuple k-space locations. Computation requirements are thus reduced due to the implementation of this overlap method.

Figure 5:
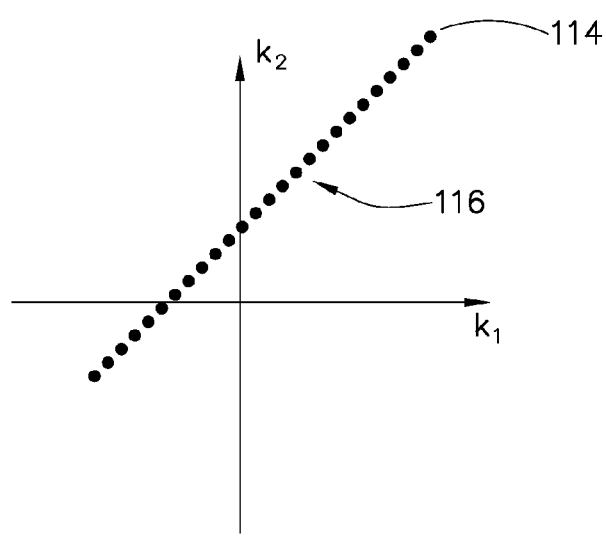
FIG. 5 is a schematic of correlation values plotted in a $K_1$, $K_2$ plane according to one embodiment of the present embodiment.

Referring now to FIG. 5, the calculated correlation values obtained from the above methods are plotted to a $K_1$-$K_2$ plane. The $K_1$-$K_2$ plane displays a 1-D k-space of all correlation values relating a first RF receiver coil (e.g., $j_1$) to a second RF receiver coil (e.g., $j_2$). The K1 axis relates to all encoding locations corresponding to receiver coil $j_1$, and the K2 axis relates to all encoding locations corresponding to receiver coil $j_2$. The manner in which the $K_1$-$K_2$ plane is filled with correlation values depends upon the method employed for calculating the correlation values. If individual correlation values are calculated as set forth in Eqn. 1, individual points 114 will be plotted in the $K_1$-$K_2$ plane corresponding to these correlation values. FIG. 5 shows a filling-in of the $K_1$-$K_2$ plane that employs the "overlap method" set forth in Eqn. 2. That is, the group of correlation values 116 are all at the same $k_2$-$k_1$ value. As set forth above, these correlation values relate encoding locations with a constant value between their first and second three-tuple k-space locations. The filling of the $K_1$-$K_2$ plane via the overlap method can make use of the calculations performed in generating previous correlation to reduce computation requirements and allow for a more efficient filling of the $K_1$-$K_2$ plane.

Figure 6:
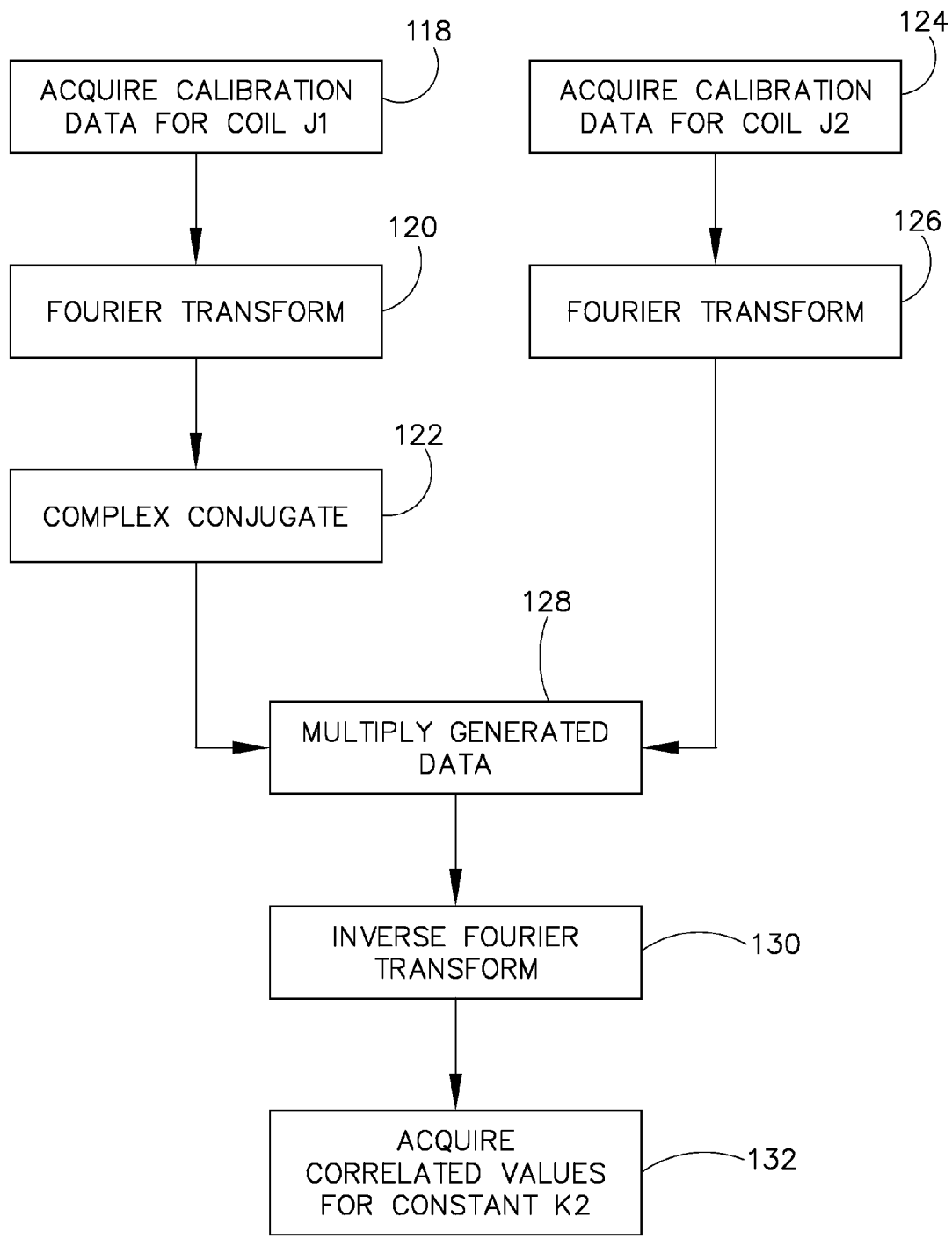
FIG. 6 is a process map showing the calculation of correlation values according to another embodiment of the present invention.

Referring now to FIG. 6, it is also envisioned that groups of correlation values can be calculated simultaneously by way of a "Fourier transform method." In such a method, a group of correlation values between any two RF receiver coils can be calculated for a constant three-tuple k-space location. That is, correlation values can be determined for all encoding locations corresponding to a first coil as related to a constant encoding location on a second coil by way of the Fourier transform method. In terms of the $K_1$-$K_2$ plane, all $K_1$ correlation values can be calculated for a constant $K_2$ value via the Fourier transform method. As shown, calibration data is acquired 118 by a first RF receiver coil (i.e., $j_1$) and a Fourier transform is taken 120 of all the calibration data acquired by receiver coil $j_1$. The complex conjugate of the Fourier transformed calibration data from $j_1$ is then determined 122. Calibration data is also acquired 124 from a second RF receiver coil (i.e., $j_2$) that is centered at a constant k-space location (e.g., $k_2$). The calibration data centered at $k_2$ for receiver coil $j_2$ is also Fourier transformed 126. The complex conjugate of the Fourier transformed calibration data from coil $j_1$ is then multiplied 128 with the Fourier transformed calibration data from coil $j_2$. An inverse Fourier transform is then taken 130 of the product of the previously multiplied values. The inverse Fourier transform of these values produces a group of all correlation values 132 between the two RF receiver coils that relate the encoding locations corresponding to receiver $j_1$ with the constant k-space location of the encoding location derived from coil $j_2$. Similar to the overlap method, the Fourier transform method reduces the computation requirements for generating a full set of correlation values between a pair of receiver coils.

Referring now to FIG. 7, the $K_1$-$K_2$ plane is shown as being filled in with correlation values generated by the Fourier transform method described above and as set forth in FIG. 6. Correlation values for a constant $K_2$ value can be plotted by way of the Fourier Transform method detailed above for all $K_1$ values, with the resulting correlation values being plotted as a horizontal line 134 on the $K_1$-$K_2$ plane for the designated $K_2$ value. That is, a group of correlation values relating all encoding locations corresponding to a first receiver coil $j_1$ with a constant encoding location on a second receiver coil $j_2$ can be calculated (i.e., a constant $K_2$ value). Thus, similar to the filling of the $K_1$-$K_2$ plane via the overlap method, the Fourier transform allows for a more efficient filling of the $K_1$-$K_2$ plane.

In filling the $K_1$-$K_2$ plane with calculated correlation values, the described overlap method and Fourier transform method can be used separately or in conjunction with one another. A filling of the $K_1$-$K_2$ space by way of both the overlap method and the Fourier transform is shown in FIG. 8 and produces a mixture of diagonal lines 136 having correlation values at the same $k_2$-$k_1$ values and horizontal lines 138 at a constant $K_2$ value. That is, upon the calculation and plotting of a horizontal line 138 of correlation values at a constant $K_2$ value via the Fourier transform method, the overlap method can then be employed to expand the points in horizontal line 138 to cover the $K_1$-$K_2$ plane. The combination of such methods to plot all correlation values between a pair of RF receiver coils reduces the overall computation requirements involved in populating a matrix of correlation values for the subsequent generation of linear coefficient weights. Besides the 1-D k-space represented by the $K_1$-$K_2$ plane shown in FIGS. 5, 7 and 8, it is also envisioned that similar plotting can be used for 2-D and 3-D k-space.

Rather than having to calculate all the correlation values between a pair of RF receiver coils in order to fill in the $K_1$-$K_2$ plane, it is also envisioned that already plotted correlation values be used to interpolate additional correlation values. As shown in FIG. 9(a), in one technique, the Fourier transform method is used to generate a plurality of lines of correlation values 140 for all $K_1$ values in a field of view, each line of correlation values having a constant $K_2$ value. Correlation values between the horizontal lines plotted by the Fourier transform method can be interpolated by a comparison between adjacent lines of correlation values having specified $K_2$ values. More specifically, correlation values are interpolated by a diagonal relationship 142 between the correlation values at the first constant $K_2$ value and the correlation values at the second constant $K_2$ value.

The interpolation of additional values in the $K_1$-$K_2$ plane via a diagonal relationship 142 between the correlation values at the first constant $K_2$ value and the correlation values at the second constant $K_2$ value is based on a desire to create a larger transition band in which the interpolated correlation values can be found. That is, FIG. 9(b) shows an $r_1$-$r_2$ plane that results from a Fourier transform of the $K_1$-$K_2$ plane. A passband 144 is shown having a diagonal relationship to the $r_1$ and $r_2$ axes. The transition band 146 formed between two stopbands 148, 150 creates sufficient bandwidth for the interpolation of correlation values. Referring back to FIG. 9(a), were two correlation values having the same $K_1$ value selected for interpolation of an additional correlation value, the transition band would be much narrower. The interpolation of additional correlation values in this manner further reduces computation requirements necessary for filling the $K_1$-$K_2$ plane with correlation values.

Figure 10:
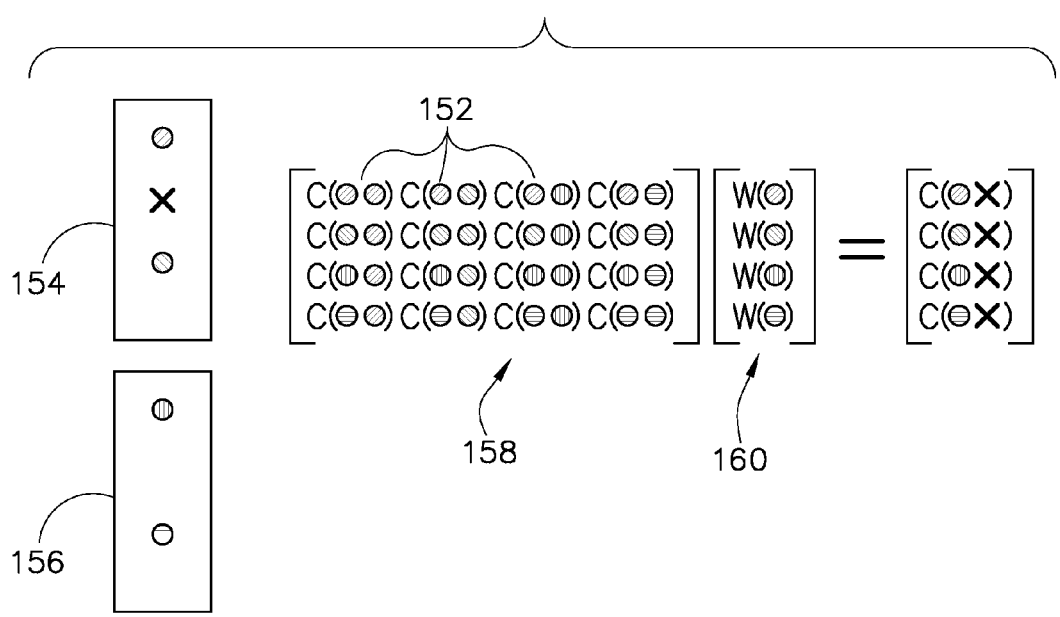
FIG. 10 is a schematic diagram of a system of linear equations according to an embodiment of the present embodiment.

Calculation of correlation values, via the individual use of or combination of any of the described methods, allows for a filling of the $K_1$-$K_2$ plane with all correlation values relating a first RF receiver coil $j_1$ to a second RF receiver coil $j_2$. From these calculated correlation values, it is possible to generate the synthesis weights (i.e., linear combination weights) used for synthesizing unacquired k-space data directly from the acquired k-space data, thus allowing for reconstruction of an image of the field of view. Referring now to FIG. 10, a linear system is provided for determining these linear combination weights. A complete set of correlation values 152 relating all encoding locations on coils $j_1$ 154 and $j_2$ 156 are entered into a matrix 158 for determining linear combination weights 160 for the coils. The generation of linear combination weights via a system of linear equations involving a matrix is known in the art, and as such, the solving of such equations need not be explained in further detail here.

As shown in FIG. 10, the matrix 158 is of size 4×4, although matrices of greater or lesser size are also envisioned. Regardless of the exact size of the correlation value matrix 158, the size of the matrix will be significantly reduced as compared to a matrix containing individual calibration data points as used in GRAPPA or other known parallel imaging techniques. A matrix containing calibration data could be, for example, of the size 100×5000. Thus, while the intermediate step of calculating correlation values via any of the methods described above may initially add additional computation time to the generation of the linear combination weights, in many instances, the computation requirements for generating the correlation values is far smaller than the computation requirements imposed by the use of calibration data in forming matrices to calculate the linear combination weights.

Upon generation of the linear combination weights, it is possible to synthesize the unacquired k-space data directly from the acquired k-space data. In one embodiment, a GRAPPA-type technique is employed where a full k-space data set is reconstructed for each RF receiver coil. Each k-space data set is then Fourier transformed into a single image such that there is an image per coil. The coil images are combined, e.g., using sum-of-squares, to create a final image. Other k-space reconstruction techniques can also be employed wherein the data sets from the RF receiver coils are used to generate a full k-space data set for one or more composite coils. Each k-space data set is then Fourier transformed into a single image such that there is a single image per composite coil. The composite images are then combined to create a final image.

In another embodiment, it is envisioned that unacquired MR data is filled-in in hybrid space. "Hybrid space" refers to the intermediate matrix that results in the performance of one of the 1D Fourier transforms that comprise the 2D Fourier transform that converts k-space to image space. In other words, in 2D Fourier imaging, one Fourier transform is performed in the frequency encoding direction and another Fourier transform is performed in the phase encoding direction. The matrix after the first 1D Fourier transform is considered a "hybrid space". That is, the data is no longer "untransformed" and therefore not considered k-space; however, the data, as a whole, is not yet in the spatial domain and, thus, not in "image space".

Upon generation of the linear coefficient weights, the weights are transformed into hybrid space weights to be applied to imaging data that has been similarly transformed into that space. That is, the linear coefficient weights are Fourier transformed in one dimension (typically the frequency-encode dimension) to form a set of hybrid weights. The k-space data sets are Fourier transformed in the one dimension to generate hybrid space data sets, where missing data in the hybrid spaces are synthesized efficiently from the acquired imaging and calibration data in hybrid space so as to yield complete hybrid spaces. The hybrid spaces are then reconstructed to respective coil images, by application of a 1D Fourier transformation in the phase encoding direction. This results in a "coil" image for each coil of the phase coil array. The individual coil images are then combined to yield a single composite image of the field of view.

In yet another embodiment, it is envisioned that, upon generation of the linear coefficient weights, the weights are transformed into image space weights to be applied to imaging data that has been similarly transformed into that space. The determining of linear coefficient weights in k-space and applying them in image space is particularly preferred for time-series acquisitions. In such a study, the calibration data is acquired in only the first acquisition. The determined weights are then applied to the first and subsequent acquisitions. In this regard, the subsequent time-series acquisitions are not burdened by the acquisition of calibration data. The calibration data and reconstruction weights can be re-acquired and updated periodically throughout the time series. A drawback to performing the application phase in image space is that it requires a uniform k-space sampling density, a condition that can only be achieved with regularly undersampled data from which the auto-calibration lines have been removed, resulting in reduced SNR and the inability to achieve flexible sampling patterns. Furthermore, the Fourier transformation of the kernel weights from k-space to image space is not negligible. However, in the case of time-series imaging where the auto-calibration data is acquired just once at the beginning of the scan and then used to reconstruct a series of time-resolved images at the same location, performing the application phase in image space becomes computationally efficient.

While the implementations set forth above describe the acquisition of k-space values at k-space grid points and the filling of a k-space matrix in a Cartesian manner, it is also understood that various other MR imaging techniques can be employed that acquire data along radial spokes or in spiral patterns that do not fall on the grid points. The use of correlation values in generating synthesis weights can be employed in these additional MR imaging techniques and is not just limited to Cartesian scans. That is, as correlation values can be interpolated in the manner previously described above for encoding locations that do not fall on k-space grid points, the use of correlation values can be extended to these alternate imaging techniques for acquisition of k-space data.

A technical contribution for the disclosed method and apparatus is that is provides for a computer implemented parallel imaging technique that generates linear combination coefficient weights by solving systems of linear equations formulated with correlation values rather than calibration data. The linear combination weights generated from the correlation values are then used for reconstructing magnetic resonance (MR) images.

Therefore, according to one embodiment of the present invention, an MRI apparatus includes a magnetic resonance imaging (MRI) system having a plurality of gradient coils positioned about a bore of a magnet to impress spatially dependent changes to a polarizing magnetic field. The MRI apparatus also includes an RF transceiver system and an RF switch controlled by a pulse module to collect RF signals from an array of RF receiver coils to acquire MR images. A computer in the MRI apparatus is programmed to acquire MR data from an imaging volume for a plurality of encoding locations using the array of RF receiver coils. The computer calculates correlation values from the MR data and generates synthesis weights based on the correlation values. The computer is further programmed to reconstruct an image based on an application of the synthesis weights to at least a portion of the MR data acquired from the array of RF receiver coils.

According to another embodiment of the invention, a method of image reconstruction of MRI data from a plurality of receiver coils includes the steps of performing an accelerated scan of a field of view with the plurality of receiver coils and acquiring k-space data from the accelerated scan for a number of k-space lines that is less than a complete number of k-space lines in the field of view. The method also includes the steps of acquiring calibration data from the accelerated scan and calculating correlation values from the calibration data. The method further includes the steps of synthesizing linear combination coefficient weights from at least one system of equations having a matrix of correlation values therein and generating an image of the field of view from the linear combination coefficient weights and the k-space data acquired in the accelerated scan.

According to yet another embodiment of the invention, a computer readable storage medium having a computer program stored thereon represents a set of instructions that are executed by a computer. The instructions causes the computer to obtain k-space data from a region of interest for a plurality of encoding locations from an RF receiver coil array, wherein each encoding location corresponds to a k-space location and a specified receiver coil in the RF receiver coil array and wherein the k-space data includes a reduced k-space data set and calibration data. The instructions also cause the computer to calculate correlation values for the plurality of encoding locations, each correlation value relating a first encoding location to a second encoding location and wherein the correlation value relating the first and second encoding locations is derived from a set of k-space data points. The instructions further cause the computer to generate linear combination coefficient weights for each of the receiver coils in the RF receiver coil array based on the correlation values and store the linear combination coefficient weights in memory.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
   a magnetic resonance imaging (MRI) system having a plurality of gradient coils positioned about a bore of a magnet to impress spatially dependent changes to a polarizing magnetic field and an RF transceiver system and an RF switch controlled by a pulse module to collect RF signals from an array of RF receiver coils to acquire MR images; and a computer programmed to:
   a) acquire MR data from an imaging volume for a plurality of encoding locations using the array of RF receiver coils;
   b) calculate correlation values from the MR data;
   c) generate synthesis weights based on the correlation values;
   d) reconstruct an image based on an application of the synthesis weights to at least a portion of the MR data acquired from the array of RF receiver coils.

2. The MRI apparatus of claim 1 wherein the computer is further programmed to define the correlation values as a complex valued number relating a first encoding location to a second encoding location.

3. The MRI apparatus of claim 2 wherein the computer is further programmed to define each of the plurality of encoding locations as a pair of values comprised of an integer coil index and a continuous-valued three-tuple k-space location.

4. The MRI apparatus of claim 3 wherein the computer is further programmed to select each of the plurality of encoding locations from calibration data gathered in the MR data.

5. The MRI apparatus of claim 4 wherein the computer is further programmed to calculate each of the correlation values from a set of calibration data by:

$$c(j_1, k_1; j_2, k_2)) = \sum_{k=k_1}^{k_c} d_{j_1}^*(k+k_1)d_{j_2}(k+k_2)$$

wherein $j_1$, $j_2$, are integer coil indices and $k_1$, $k_2$ are continuous-valued three-tuple k-space locations for defining encoding locations, $k_1$ thru $k_C$ denote C calibration points and $d_j(k)$ denotes data acquired at encoding location $(j, k)$.

6. The MRI apparatus of claim 5 wherein the computer is further programmed to calculate a plurality of correlation values between a first integer coil index and a second integer coil index for pairs of encoding locations having a constant difference value between a first three-tuple k-space location and a second three-tuple k-space location as defined by:

$$c(j_1, k_1 + \Delta k; j_2, k_2 + \Delta k)) = \sum_{k=k_1}^{k_c} d_{j_1}^*(k+k_1+\Delta k)d_{j_2}(k+k_2+\Delta k)$$
$$= \sum_{k'=k_1+\Delta k}^{k_c+\Delta k} d_{j_1}^*(k'+k_1)d_{j_2}(k'+k_2).$$

wherein $j_1$, $j_2$, are integer coil indices and $k_1$, $k_2$ are continuous-valued three-tuple k-space locations for defining encoding locations, $k_1$ thru $k_C$ denote C calibration points, $d_j(k)$ denotes data acquired at encoding location $(j, k)$, and $\Delta k$ is an offset distance between calibration data points.

7. The MRI apparatus of claim 4 wherein the computer is further programmed to calculate a plurality of correlation values between a first integer coil index and a second integer coil index, the plurality of correlation values relating a plurality of encoding locations corresponding to the first integer coil index to a constant encoding location corresponding to the second integer coil index.

8. The MRI apparatus of claim 7 wherein the computer is further programmed to calculate correlation values by:
   calculating a first set of correlation values between a first integer coil index and a second integer coil index, the first set of correlation values relating a plurality of encoding locations corresponding to the first integer coil index to a constant encoding location corresponding to the second integer coil index; and
   calculating a second set of correlation values between the first integer coil index and the second integer coil index for pairs of encoding locations having a constant difference value between a first three-tuple k-space location and a second three-tuple k-space location.

9. The MRI apparatus of claim 7 wherein the computer is further programmed to interpolate a set of correlation values from the calculated plurality of correlation values.

10. The MRI apparatus of claim 1 wherein the computer is further programmed to fill in a portion of unacquired MR data based on the synthesis weights and the MR data in one of k-space, hybrid space, and image space.

11. A method of image reconstruction of MRI data from a plurality of receiver coils comprising the steps of:
   performing an accelerated scan of a field of view with the plurality of receiver coils;
   acquiring k-space data from the accelerated scan for a number of k-space lines that is less than a complete number of k-space lines in the field of view;
   acquiring calibration data from the accelerated scan for a plurality of encoding locations;
   calculating correlation values from the calibration data;
   synthesizing linear combination coefficient weights from at least one system of equations having a matrix of correlation values therein; and
   generating an image of the field of view from the linear combination coefficient weights and the k-space data acquired in the accelerated scan.

12. The method of claim 11 further comprising the step of identifying each of the plurality of encoding locations based on a k-space location and a specified receiver coil in the plurality of receiver coils.

13. The method of claim 11 wherein the step of calculating correlation values from the calibration data further comprises relating a first encoding location in a k-space neighborhood of calibration data to a second encoding location in the k-space neighborhood of calibration data and is determined by:

$$c(j_1, k_1; j_2, k_2)) = \sum_{k=k_1}^{k_c} d_{j_1}^*(k+k_1)d_{j_2}(k+k_2)$$

wherein $j_1$, $j_2$, are integer coil indices and $k_1$, $k_2$ are continuous-valued three-tuple k-space locations for defining encoding locations, $k_1$ thru $k_C$ denote C calibration points, and $d_j(k)$ denotes data acquired at encoding location $(j, k)$.

14. The method of claim 13 wherein the step of calculating correlation values from the calibration data further comprises calculating a group of correlation values between a first specified receiver coil and a second specified receiver coil for k-space neighborhoods having a constant k-space offset, as defined by:

$$c(j_1, k_1 + \Delta k; j_2, k_2 + \Delta k)) = \sum_{k=k_1}^{k_c} d_{j_1}^*(k+k_1+\Delta k)d_{j_2}(k+k_2+\Delta k)$$

-continued $$= \sum_{k'=k_1+\Delta k}^{k_c+\Delta k} d_{j_1}^*(k'+k_1)d_{j_2}(k'+k_2).$$

wherein $j_1$, $j_2$, are integer coil indices and $k_1$, $k_2$ are continuous-valued three-tuple k-space locations for defining encoding locations, $k_1$ thru $k_C$ denote C calibration points, $d_j(k)$ denotes data acquired at encoding location (j, k), and $\Delta k$ is an offset distance between calibration data points.

15. The method of claim 12 wherein the step of calculating correlation values from the calibration data further comprises:
    performing a Fourier transform on calibration data received from a first specified RF receiver coil;
    determining a complex conjugate of the Fourier transformed calibration data received from the first specified RF receiver coil;
    performing a Fourier transform on calibration data received from a second specified RF receiver coil, the calibration data from the second specified RF receiver coil being centered at a constant k-space location;
    multiplying the complex conjugate of the Fourier transformed calibration data received from the first specified RF receiver coil with the Fourier transformed calibration data received from the second specified RF receiver coil to receive a product therefrom; and
    performing an inverse Fourier transform on the product to generate a plurality of correlation values between the first specified receiver coil and the second specified receiver coil and relating to the constant k-space location.

16. The method of claim 15 further comprising the step of interpolating a set of correlation values from the generated plurality of correlation values, the generated plurality of correlation values comprising a first group of correlation values at a first constant k-space location on a receiver coil and a second group of correlation values at a second constant k-space location on the receiver coil.

17. The method of claim 16 wherein the step of interpolating a set of correlation values further comprises interpolating by a diagonal relationship between correlation values at the first constant k-space location and at the second constant k-space location.

18. The method of claim 11 wherein the step of generating an image further comprises filling in k-space data in a number of k-space lines for which k-space data was not acquired in the accelerated scan based on the linear combination coefficient weights and the calibration data.

19. The method of claim 11 wherein the step of generating an image further comprises:
    performing a 1-D Fourier transform on the acquired k-space data to obtain hybrid space data;
    performing a 1-D Fourier transform of the linear coefficient weights to obtain a set of hybrid weights; and
    filling in the hybrid space data in a number of hybrid space lines for which k-space data was not acquired in the accelerated scan based on the obtained hybrid space data and the hybrid weights.

20. The method of claim 11 wherein the step of generating an image further comprises:
    performing a 2-D Fourier transform on the acquired k-space data to obtain imaging data;
    performing a 2-D Fourier transform of the linear coefficient weights to obtain a set of image weights; and
    generating an image of the field of view in image space.

21. The method of claim 11 wherein the step of generating an image further comprises:
    performing a 3-D Fourier transform on the acquired k-space data to obtain imaging data;
    performing a 3-D Fourier transform of the linear coefficient weights to obtain a set of image weights; and
    generating an image of the field of view in image space.

22. A computer readable storage medium having a computer program stored thereon and representing a set of instructions that when executed by a computer causes the computer to:
    obtain k-space data from a region of interest for a plurality of encoding locations from an RF receiver coil array, wherein each encoding location corresponds to a k-space location and a specified receiver coil in the RF receiver coil array and wherein the k-space data includes a reduced k-space data set and calibration data;
    calculate correlation values for the plurality of encoding locations, each correlation value relating a first encoding location to a second encoding location and wherein the correlation value relating the first and second encoding locations is derived from a set of k-space data points;
    generate linear combination coefficient weights for each of the receiver coils in the RF receiver coil array based on the correlation values; and
    store the linear combination coefficient weights in memory.

23. The computer readable storage medium of claim 22 wherein the computer is further programmed to calculate individual correlation values from the set of k-space data points by:

$$c(j_1, k_1; j_2, k_2)) = \sum_{k=k_1}^{k_c} d_{j_1}^*(k+k_1)d_{j_2}(k+k_2)$$

wherein $j_1$, $j_2$, are integer coil indices and $k_1$, $k_2$ are continuous-valued three-tuple k-space locations for defining encoding locations, $k_1$ thru $k_C$ denote C calibration points and $d_j(k)$ denotes data acquired at encoding location (j, k).

24. The computer readable storage medium of claim 23 wherein the computer is further programmed to calculate a plurality of correlation values for pairs of encoding locations having a difference value equal to $k_2-k_1$ by:

$$c(j_1, k_1+\Delta k; j_2, k_2+\Delta k)) = \sum_{k=k_1}^{k_c} d_{j_1}^*(k+k_1+\Delta k)d_{j_2}(k+k_2+\Delta k)$$

$$= \sum_{k'=k_1+\Delta k}^{k_c+\Delta k} d_{j_1}^*(k'+k_1)d_{j_2}(k'+k_2)$$

wherein $j_1$, $k_2$, are integer coil indices and $k_1$, $k_2$ are continuous-valued three-tuple k-space locations for defining encoding locations, $k_1$ thru $k_C$ denote C calibration points, $d_j(k)$ denotes data acquired at encoding location (j, k), and $\Delta k$ is an offset distance between calibration data points.

25. The computer readable storage medium of claim 22 wherein the computer is further programmed to calculate a plurality of correlation values relating k-space locations derived from a first specified receiver coil to a constant k-space location on a second specified receiver coil.

26. The computer readable storage medium of claim 22 wherein the computer is further programmed to interpolate additional correlation values from previously calculated correlation values.

27. The computer readable storage medium of claim 22 wherein the computer is further programmed to:

synthesize unacquired data from the reduced k-space data set and linear combination coefficient weights; and generate an unaliased image of the region of interest from the reduced k-space data set and the synthesized data.

* * * * *

UNITED STATES PATENT AND TRADEMARK OFFICE
CERTIFICATE OF CORRECTION

PATENT NO. : 7,768,264 B1
APPLICATION NO. : 11/744329
DATED : August 3, 2010
INVENTOR(S) : Brau et al.

It is certified that error appears in the above-identified patent and that said Letters Patent is hereby corrected as shown below:

Col. 1, delete and replace the GOVERNMENT LICENSE RIGHTS paragraph with:

"This invention was made with Government support under contracts HL039297 and HL075803 awarded by the National Institutes of Health. The Government has certain rights in this invention.".

Col. 16, line 60 (Claim 24), delete "$k_2$," and substitute therefore -- $j_2$, --.

Signed and Sealed this

Twenty-sixth Day of October, 2010

David J. Kappos
*Director of the United States Patent and Trademark Office*